United States Patent [19]

Brighton et al.

[11] Patent Number: 4,866,008
[45] Date of Patent: Sep. 12, 1989

[54] METHODS FOR FORMING SELF-ALIGNED CONDUCTIVE PILLARS ON INTERCONNECTS

[75] Inventors: Jeffrey E. Brighton, Katy; Bobby A. Roane, Manuel, both of Tex.

[73] Assignee: Texas Instruments Incorporated, Dallas, Tex.

[21] Appl. No.: 131,969

[22] Filed: Dec. 11, 1987

[51] Int. Cl.$^4$ .......................................... H01L 21/283
[52] U.S. Cl. .................... 437/189; 437/192; 437/198; 437/246; 437/182; 437/228; 437/230; 437/183; 357/71
[58] Field of Search ............... 437/182, 183, 189, 190, 437/191, 192, 195, 200, 201, 245, 246, 198, 228, 230, 944; 357/67, 71; 148/DIG. 26

[56] References Cited

U.S. PATENT DOCUMENTS 4,434,544  3/1984  Dohya et al. ................... 437/245
4,652,336  3/1987  Andrascek et al. .......... 357/71 R X

FOREIGN PATENT DOCUMENTS 0020521  2/1985  Japan ................................ 437/192
0217646  10/1985  Japan ................................ 437/192

Primary Examiner—Brian E. Hearn
Assistant Examiner—T. N. Quach
Attorney, Agent, or Firm—Michael E. Melton; Leo N. Heiting; Melvin Sharp

[57] ABSTRACT

Methods, of forming a self-aligned conductive pillar (16) on an interconnect (12) on a body (10) having semi-conducting surfaces. A first mask (24) defines an inverse pattern for formation of an interconnect (12). The interconnect (12) is formed by additive metallization processes. A second mask (26) is formed over portions of the first mask (24) and the interconnect (12). Sidewalls of the first mask (24) which define at least one side of side of said interconnect (12) serve to also define at least one side of said conductive pillar (16). The second mask (26) also defines at least one side of the conductive pillar (16). The conductive pillar (16) is formed by additive metal deposition processes. The conductive pillar (16) is thus self-aligned to the interconnect (12) on which it is formed. A cladding layer of tungsten (40) can be used on the multiple layers of seed layer (22), e.g. molybdenum coated with thin copper, of copper interconnects (12/14), and of conductive pillars (16/18). Feed layer of nickel and gold interconnect are also disclosed.

28 Claims, 1 Drawing Sheet

METHODS FOR FORMING SELF-ALIGNED CONDUCTIVE PILLARS ON INTERCONNECTS

TECHNICAL FIELD OF THE INVENTION

The present invention relates to fabrication of semiconductor devices. More particularly, the present invention relates to self-aligned methods for forming conductive pillars on metal interconnects of semiconductor devices.

BACKGROUND OF THE INVENTION

The fabrication of semiconductor devices frequently requires the interconnection of different metal layers on the semiconductor device. The metal layers are typically separated by an isolation material generally referred to as intermediate dielectric.

Standard techniques for interconnecting the metal layers through the intermediate dielectric are termed the "via process" wherein a hole is etched through the intermediate dielectric to form a via or access to the lower level metallization, and the hole is filled with a conductive material which serves the interconnect the lower metallization layer with an upper metallization layer.

Various problems arise in the formation of the vias and the conductive materials in the vias which connect the upper and lower metallization layers. Significant problems arise when the sidewalls of the via are not sloped at the optimum angle for forming the metal material which connects the upper and lower metallization layers. Additional problems arise from misalignment of the via over the appropriate structures on the upper and lower metallization layers. The misalignment and misalignment tolerances required for the via process dictate either reduced packing densities for structures on the device, or down sized vias which lead to increased current density and resistance in the conductive material which fills the via.

Accordingly, it has been found desirable to provide a method for forming conductive pillars from lower level metallization interconnects to upper level metallization layers by processes which facilitate an increased packing density of structures on the device and a decreased current density in the conductive pillars between metallization layers.

SUMMARY OF THE INVENTION

The present invention provides methods, and products formed by such methods, of forming self-aligned conductive pillars on lower level metallization interconnects. A first patterning layer or mask defines the interconnects to be formed in a first metallization layer. The same first patterning layer also serves to self-align conductive pillars to be formed on the respective interconnects of the first metallization layer. The first patterning layer or mask defines one dimension or at least one side of the conductive pillar to be formed over the first level metallization interconnect. A second patterning layer or mask is formed over the first patterning layer and defines a second dimension or at least one side of the conductive pillar to be formed over the first metallization layer interconnect.

The present invention provides the advantages of increased packing density of structures on the semiconductor device.

The present invention also provides advantages of reduced current density in the conductive pillars formed over the first metallization layer interconnects.

The present invention also provides the advantage of a reduced resistance in the conductive pillars formed over the first metallization layer interconnects.

The present invention provides the advantage of a method by which the conductive pillars are formed by a self-aligned process over the first metallization layer interconnects of the semiconductor device.

The present invention provides the advantages of reduced number of processes steps for forming conductive pillars over interconnects of a lower level metallization layer.

DETAILED DESCRIPTION OF THE DRAWINGS

The present invention provides methods, and products made by such methods, of forming interconnects and self-aligned conductive pillars on the interconnects formed on surfaces of a semiconductive device. The present invention utilizes metal additive processes, i.e., processes which add metal to form the interconnects and conductive pillars, rather than subtractive processes, i.e., processes which remove part of a previously formed metallization layer to leave only those portions of the metallization layer which serve as interconnects on the device. The present invention also uses a self-aligned technique for forming pillars on interconnects with advantages in reduced current density and increased packing density resulting from these techniques.

Figure 1:
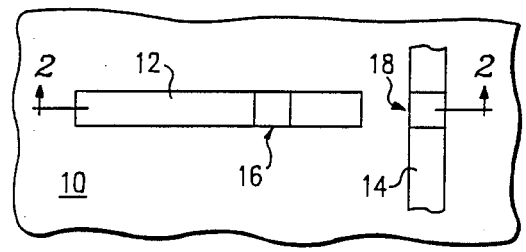
FIG. 1 is a plan view of the device having semiconducting areas and on which has been fabricated interconnects and conductive pillars according to an embodiment of the present invention.

FIG. 1 shows a plan view of a device 10 having semiconducting areas and fabricated according to methods of the present invention. Also shown in FIG. 1 are two interconnects 12 and 14 which have been formed on the device 10. Conductive pillars 16 and 18 have been formed over portions of interconnects 12 and 14 respectively.

Figure 2:
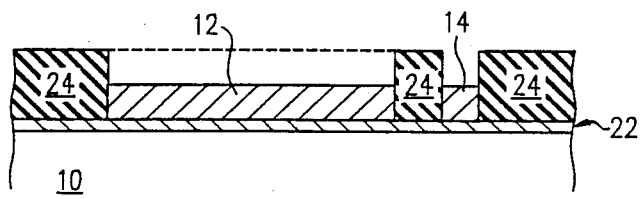
FIG. 2 is a cross sectional side view of the device of FIG. 1 taken along section line 2—2 illustrating steps in the fabrication of the device of FIG. 1, and wherein a seed layer, first mask, and interconnects have been formed on the device.

FIG. 2 shows a cross-sectional side view of the device of FIG. 1 illustrating steps in the fabrication of the device of FIG. 1 according to an embodiment of the present invention. In FIG. 2 is shown the device 10 having semiconducting surfaces on which has been formed certain structures pursuant to fabrication steps according to the present invention. Formed over device 10 is a seed layer 22 which comprises a layer of molybdenum formed on the device 10 and relatively thin layer of copper formed on the layer of molybdenum. Over the seed layer 22 has been formed a layer of photoresist 24 which has been inversely patterned and developed to define the reverse pattern on mask of the interconnects to be formed on the device 10. Shown at 24 on FIG. 2 are portions of the photoresist remaining after such inverse patterning. After patterning and development of the photoresist 24, the metal interconnects 12 and 14 are formed on the seed layer 22 of the device 10. The interconnects 12 and 14 are formed by a conventional electroplating process or alternatively by an electroless plating process by which the desired depth of copper is plated into these regions of the seed layer 22 defined by the inverse pattern of photoresist 24. During the electroplating process, a layer of copper is not deposited on the photoresist 24. The seed layer 22 enhances the formation of the interconnects 12 and 14 by way of the plating process.

FIG. 2 illustrates also that the interconnects 12 and 14 are formed to a height above the seed layer 22 which is less than the height of the photoresist layer 24 above the seed layer 22. It is this difference in the height of the photoresist 24 over that of the interconnects 12 and 14 which facilitates the self-aligning aspect of the present invention in forming conductive pillars to the interconnects 12 and 14.

Figure 3:
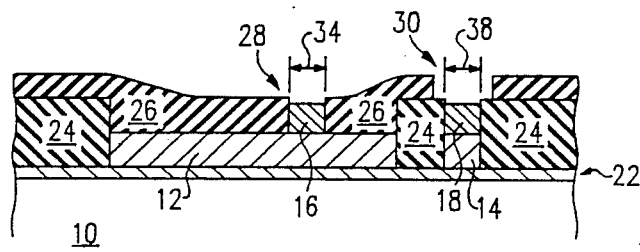
FIG. 3 shows a cross sectional side view of the embodiment of FIG. 2 illustrating additional steps in an embodiment of the present invention, showing a second mask and conductive pillars formed on the device.

FIG. 3 is a cross-sectional side view of the embodiment of FIG. 2 illustrating additional steps in the method of the present invention. FIG. 3 shows that after the steps illustrated in FIG. 2 have been completed, a second layer of photoresist 26 is formed over the device. The second layer of photoresist 26 is patterned to form a mask in an inverse pattern defining certain dimensions of the conductive pillars to be formed over the interconnects 12 and 14.

A next step in the method of the present invention is to form conductive pillars 16 and 18 on the interconnects 12 and 14 respectively. This is accomplished by a second electroplating process. In the embodiment being described, the connective pillars 16 and 18 comprise copper. As is illustrated in FIG. 3, the height of the conductive pillars 16 and 18 above the seed layer 22 is less than the height of those regions of the first photoresist 24 which are adjacent to the respective conductive pillars.

Figure 4:
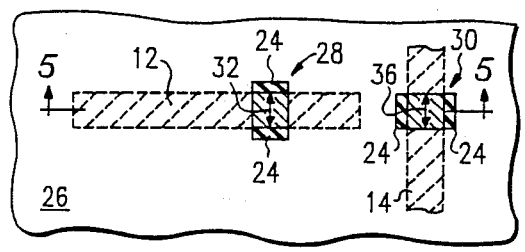
FIG. 4 shows a plan view of the device of FIG. 1 at a point in fabrication midway through the steps illustrated in FIG. 3.

FIG. 4 shows a plan view of the device of FIG.1 at a point in fabrication midway through the steps illustrated in FIG. 3. FIG. 4 shows the device at a point in fabrication at which the second layer of photoresist 26 has been formed over the device and inversely patterned and developed to provide openings in the second layer of photoresist 26 corresponding to the locations of the conductive pillars 16 and 18 to be formed over interconnects 12 and 14 respectively. Interconnects 12 and 14 are shown in FIG. 4 in dotted outline below the second layer of photoresist 26. The opening in the second layer of photoresist 26 in which the conductive pillar 16 will be formed is shown at 28 in FIG. 4. Exposed through the opening 28 is a portion of the interconnect 12 and portions of the first layer of photoresist 24. Also shown in FIG. 4 is an opening 30 which corresponds to the location for formation of conductive pillar 18. Exposed through opening 30 is a portion of interconnect 14 and regions of the first photoresist 24.

As shown in the plan view of FIG. 4, the pillar pattern defined by the opening in the second photoresist layer 26 actually overlaps on both sides of the pattern in the first photoresist layer 24 for the interconnect pattern.

Reference to FIGS. 3 and 4 illustrates how the combination of the first photoresist and the second photoresist define the geometry of the conductive pillars formed. For conductive pillar 16, the dimension of the pillar in a direction of arrows 32 in FIG. 4, is defined by the sidewalls of the first photoresist layer 24. The dimension of the conductive pillar 16 in a direction shown by arrows 34 of FIG. 3 is defined by the sidewalls of opening 28 in the second layer of photoresist 26 as is shown in FIG. 3. Similarly, the dimensions of the conductive pillar 18 are defined by the sidewalls of regions of the first and second photoresist layers 24 and 26 respectively. The dimension of the conductive pillar 18 in a direction of arrows 36 of FIG. 4 is defined by the sidewalls of the second photoresist layer 28 as shown in FIG. 4. The dimension of the conductive pillar 18 in the direction shown by arrows 38 in FIG. 3 is defined by the sidewalls of the first photoresist 24. Accordingly, it can be seen how the sidewalls of the first photoreist layer 24 serve to define at least one dimension of the conductive pillar formed on each of the interconnect 12 and 14. Because the same sidewall (i.e., the sidewall of the first photoresist layer 24) is used to form both the interconnect and the conductive pillar on top of the interconnect, the process is said to be self-aligned. Since the dimension of the conductive pillar formed over the interconnect, at least in the direction defined by the first photoresist layer (i.e., in the direction of arrows 32 and 38 respectively) is defined by the same sidewall, the dimensions of each conductive pillar and its respective interconnect correspond exactly in that direction.

Figure 5:
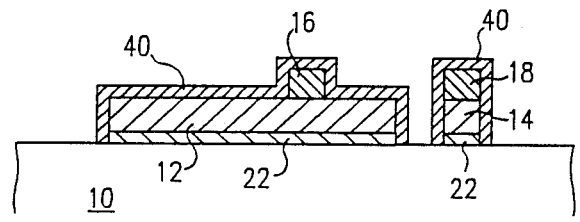
FIG. 5 shows a cross sectional side view of the device of FIG. 3 taken along section line 5—5 illustrating additional steps in an embodiment of the present invention, after the first and second masks have been stripped away and the interconnects and conductive pillars have been clad with a refractory metal.

FIG. 5 shows a cross-sectional sideview of the device of FIG. 3 illustrating additional steps in the embodiment of the present invention being described. After formation of the conductive pillars 16 and 18, the second and the first photoresist layers 26 and 24, respectively, are stripped away from the device 10. Next, those regions of the seed layer not covered by the interconnects 12 and 14 are etched away, in the embodiment described, by an ion beam etch process. Next, the copper interconnects 12 and 14 as well as the conductive pillars 16 and 18 are clad with a tungsten layer by a selective tungsten deposition process to form a cladding layer 40 which covers the interconnects and conductive pillars. The cladding layer 40 in conjunction with the seed layer 22 serves to inhibit poisoning from the copper materials of the interconnects and pillars into surrounding materials of the completed device. After the cladding layer 40 has been formed, the interconnects and pillars are covered with dielectric or isolation materials which can be planarized to expose the tops of conductive pillars 16 and 18 while isolating the interconencs 12 and 14 below the dielectric layer. Additional structures can then be formed on the device.

Typically, the seed layer 22 is formed over a layer of oxide or other isolation material which has been formed over the surface of the device 10. Also, contacts typically have been formed through the oxide or insulation layer to provide electrical contact between the interconnects 12 and 14 which are formed on the device and the structures which have been built on the device below the oxide or insulation layer.

Although, in the preferred embodiment, the interconnects and conductive pillars comprise copper, a wide variety of conductors could be used to form the interconnects and conductive pillars. Other materials which could be use include gold or aluminum, or other appropriate conductive materials.

Different materials other than photoresist can be used for the patterns of the interconnects and the conductive pillars. For example, silicon dioxide could be used or any other material which can define the pattern for the interconnects and conductive pillars it is also important that the material be one which can be removed from the device after the interconnects and conductive pillars have been formed by a process which does not damage the conductors. Photoresist is preferred because it can be easily removed by chemicals which do not affect the interconnects and conductive pillars over the seed layer.

In the preferred embodiment illustrated in FIGS. 1 through 5, the deposition of the materials forming the interconnect and conductive pillars was accomplished by an electroplating or electroless plating process. Other processes besides the plating process can also be used to form the interconnects and pillars. For example, a lift-off or evaporation process can be used to form the interconnects or conductive pillars. In the lift-off process, a source of metal for deposition is heated in a vacuum, metal atoms evaporate from the metal source and travel through the vacuum to deposit on the device. Since the metal deposits in a line of sight fashion, after deposition of the metal, the sidewalls of the pattern (e.g. photoresist) do not have a layer of metal formed on them. Accordingly, after deposition of the metal, the patterning material can be stripped. When the patterning material is stripped, the metal formed over the non-sidewall surfaces of the patterning material is also removed, leaving the desired interconnect or conductive pillar structures on the device. Other additive metallization processes could also be used as long as they allow for use of the first patterning material as a self-aligning feature in forming the conductive pillars and which also allow for removal of the patterning material after deposition of the metal.

In the preferred embodiment described in conjunction with FIGS. 1 through 5, the seed layer comprises a layer of molybdenum on which is formed a relatively thin layer of copper. The seed layer enhances the formation of the interconnect by electroplating processes. Moreover, the molybdenum layer of the seed layer serves to inhibit the copper from poisoning or adversely affecting surrounding materials or structures of the device. The molybdenum layer may actually comprise other materials besides molybdenum which serve the same function. Preferred materials for the molybdenum layers comprise refractory metals. In some embodiments, the refractory or molybdenum layer may be omitted. Moreover, in some embodiments, depending on the particular metallization process to be used to form the interconnects, a seed layer may not be necessary and so may be omitted. The materials of the seed layer should be selected for compatibility with the conductive properties desired, the particular conductive material to be used to form the interconnect, and considerations arising from the metallization process to be used to form the interconnects and pillars as well as other considerations. For example, if gold is used as the interconnect material, a preferred combination for the seed layer is a layer of molybdenum covered with a thin layer of nickel. The nickel facilitates formation of the gold interconnect by an electroless plating process over the seed layer.

As shown in conjunction with FIG. 5, the interconnect and conductive pillars are frequently clad with a refractory metal such as tungsten. The cladding material may comprise refractory metals besides tungsten, or other materials as desired. Additionally, the cladding step can be omitted in certain embodiments.

As stated previously, it is important that the depth of the first photoresist or patterning layer over the seed layer be greater than the depth of the interconnect formed over the seed layer. This facilitates the sidewall of the patterning layer functioning in a self-aligned fashion to form one wall of the conductive pillar formed over the interconnect. Typical depths for the first patterning material are from one micron or less to 2.5 microns or greater. Typical depths for the electroless copper plated interconnect layer are from one fourth micron or less to one mircon or greater. A preferred thickness of the interconnect layer is ¾ of a micron. Typical heights or depths for the conductive pillars are about one micron, although a lesser or greater depth could also be used. After formation of the interconnects and pillars as shown in FIG. 5, it is usually preferable to have an adequate dielectric thickness over the interconnect layer to minimize parasitic capacitance between the interconnect metal layer and structures above the dielectric layer. Accordingly, a preferred minimum thickness for the dielectric above the interconnect layer is approximately 7000 angstroms, although a lesser thickness could also be used as desired.

During the tech of the seed layer as described in conjunction with FIG. 5, it is preferred to use an etch that is selective to the interconnect and conductive pillar material so that only the seed layer is removed during the etch process. Etch processes which are not selective to the interconnect and conductive pillar metal are also acceptable, it should just be realized that the processes etch back a part of the interconnect and conductive pillar while etching back the seed layer. Since the seed layer is significantly thinner than the metallization layer, the depths of the interconnects and pillars can be designed to allow for the slight etch back to remove the seed layer.

The self-aligned feature of the present invention (i.e., the fact that the conductive pillars are self-aligned over the interconnects) provides significant advantages. One of the advantages is that the width of the pillar can be the same as the width of the interconnect. This is because the pattern that defines the width of the interconnect, also defines the width of the conductive pillar. If a self-aligned technique were not used, the width of the pillar would have to be less than the width of the interconnect to allow for misalignment tolerances during the patterning of the pillar pattern. A reduced width of the pillar would result in increased current density through the pillars which would also undesirably increase the resistance of the pillar. The other option, if the present invention is not utilized, to reducing the width of the conductive pillar is to provide greater space between interconnects to allow for misalignment tolerances of the wider conductive pillars. However, this strategy results in a reduced packing density of interconnects on the device and is accordingly undesirable.

Accordingly, the self-aligned feature of the present invention provides the advantage of a reduced current density and consequent reduced resistance through the conductive pillars and also, an increased packing density of interconnects and conductive pillars on the device.

While preferred embodiments and their advantages have been disclosed in the above detailed description, the invention is not limited thereto, but only by the spirit and scope of the appended claims.

What is claimed is:

1. A method of forming a self-aligned conductive pillar on a metal interconnect on a body having semiconducting surfaces, the method comprising:
   forming a first mask on said body, said first mask defining an inverse pattern for the formation of an interconnect on said body;
   forming a metal interconnect on said body in the pattern defined by said first mask;
   forming a second mask on said body, said second mask covering at least a portion of said first mask and also covering a portion of said metal interconnect, said second mask providing a space directly over a portion of said metal interconnect for forming said self-aligned conductive pillar, said second mask defining an inverse pattern for forming at least one side of said self-aligned conductive pillar;
   said inverse pattern of said first mask defining at least one side of said conductive pillar to be formed; and
   forming said self aligned conductive pillar in said space of said second mask directly over a portion of said metal interconnect.

2. The method of claim 1, wherein said conductive pillar is formed to a height above said interconnect not greater than the height above said interconnect of the wall of said first mask which defines at least one side of said pillar.

3. The method of claim 2, wherein said interconnect and said conductive pillar comprise copper.

4. The method of claim 1, wherein at least one side of said conductive pillar is self-aligned with said interconnect, at least one side of said conductive pillar being defined by the same sidewalls of said first mask which define the sides of said interconnect which are below said conductive pillar.

5. The method of claim 1, wherein said conductive pillar is formed by a lift-off process.

6. The method of claim 2, wherein said first mask and said interconnect are formed on a seed layer on said body, which seed layer comprises a conductive metal.

7. The method of claim 1, wherein said conductive pillar formed over a portion of said metal interconnect has a vertical height above the surface of said body which is less than the vertical height of the sidewall of said first mask which is adjacent to said conductive pillar.

8. The method of claim 1, wherein said metal interconnect and said conductive pillar comprise copper.

9. The method of claim 1, wherein said metal interconnect comprises gold.

10. The method of claim 1, wherein said interconnect and said conductive pillar are each formed on said body by an electroplating process.

11. The method of claim 1, wherein said first and second masks comprise photoresist.

12. The method of claim 1, wherein said first mask and said interconnect are formed on a seed layer on said body, which seed layer comprises a conductive metal.

13. The method of claim 12, further comprising: removing said first and second masks after said step of forming said conductive pillar;
   removing portions of said seed layer not covered by said interconnect;
   forming a layer of isolation material on said body, said layer of isolation material covering said interconnect with at least a portion of said conductive pillar exposed at the surface of said layer of isolation material; and
   forming a second interconnect on said body, said second interconnect being formed over said layer of isolation material, and said second interconnect also making electrical contact with at least a portion of said conductive pillar.

14. The method of claim 13, wherein said layer of isolation material comprises a dielectric material.

15. The method of claim 6, further comprising:
   removing said first and second masks after said step of forming said conductive pillar;
   removing portions of said seed layer not covered by said interconnect;
   forming a layer of isolation material on said body, said layer of isolation material covering said interconnect with at least a portion of said conductive pillar exposed at the surface of said layer of isolation material; and
   forming a second interconnect on said body, said second interconnect being formed over said layer of isolation material, and said second interconnect also making electrical contact with at least a portion of said conductive pillar.

16. A method of forming a conductive pillar on a metal interconnect on a body having semiconducting surfaces, the method comprising:
   forming a seed layer on a surface of said body;
   forming a first mask on said seed layer;
   forming a metal interconnect in a region defined by said first mask on said seed layer;
   forming a second mask on said body, said second mask covering a portion of said interconnect and a portion of said first mask, said second mask defining a first side of said conductive pillar which first side is over said interconnect;
   said first mask having sidewalls defining said interconnect to be formed, and also defining a second side of said conducting pillar to be formed, said sidewalls having a height at the location of formation of said interconnect and said second side of said pillar sufficient to define said second side of said pillar above said interconnect;
   forming said conductive pillar;
   removing said second mask and said first mask;
   etching away portions of said seed layer exposed after removal of said first mask; and
   forming an isolation layer over said body, including over said interconnect, but allowing at least a portion of said conductive pillar to be exposed at the surface of said isolation layer.

17. The method of claim 16, wherein said seed layer comprises a layer of a refractory metal and a layer of copper.

18. The method of claim 16, wherein said interconnect comprises copper and wherein said conductive pillar comprises copper.

19. The method of claim 18, further comprising cladding wherein said interconnect and said conducting pillar with a refractory metal.

20. The method of claim 17, wherein said layer of refractory metal comprises molybdenum.

21. The method of claim 16, wherein said first mask comprises photoresist.

22. The method of claim 21, wherein said second mask comprises photoresist.

23. The method of claim 16, further comprising:
forming a second interconnect over said isolation layer, said second interconnect providing electrical contact between said conductive pillar and said second interconnect.

24. The method of claim 16, wherein said interconnect and said conductive pillar are formed by an electroplating process.

25. The method of claim 19, wherein said refractory metal comprises tungsten.

26. The method of claim 16, wherein said seed layer comprises a layer of nickel and said interconnect comprises gold.

27. The method of claim 16, wherein second side of said conductive pillar is aligned with a side of said interconnect.

28. The method of claim 16, wherein the height of said conductive pillar above said seed layer is less than the height of the sidewall of said first mask which defines a side of said conductive pillar.

* * * * *